(12) United States Patent
Lam et al.

(10) Patent No.: US 11,739,411 B2
(45) Date of Patent: Aug. 29, 2023

(54) LATTICE COAT SURFACE ENHANCEMENT FOR CHAMBER COMPONENTS

(71) Applicant: Applied Materials, Inc., Santa Clara, CA (US)

(72) Inventors: Lit Ping Lam, Singapore (SG); Sriskantharajah Thirunavukarasu, Singapore (SG); Ian Ong, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 730 days.

(21) Appl. No.: 16/673,196

(22) Filed: Nov. 4, 2019

(65) Prior Publication Data

US 2021/0130948 A1 May 6, 2021

(51) Int. Cl.
*C23C 14/00* (2006.01)
*H01J 37/32* (2006.01)
(Continued)

(52) U.S. Cl.
CPC .......... *C23C 14/0068* (2013.01); *B22F 10/00* (2021.01); *B33Y 80/00* (2014.12);
(Continued)

(58) Field of Classification Search
CPC ............ C23C 14/0068; C23C 16/4404; C23C 14/358; C23C 14/50; C23C 16/4401; C23C 16/4585; B22F 10/00; B22F 3/1115; B22F 5/106; B22F 10/10; B22F 10/20; B33Y 80/00; B81C 1/00373; H01J 37/32477; H01J 37/3488; H01J 37/3211; H01J 37/32495; H01J 37/32807; B01L 1/00;
(Continued)

(56) References Cited

U.S. PATENT DOCUMENTS

| 5,459,297 A | 10/1995 | Boppel et al. |
| 6,506,312 B1 | 1/2003 | Bottomfield |

(Continued)

FOREIGN PATENT DOCUMENTS

| CN | 1577732 A | 2/2005 |
| CN | 1806316 A | 7/2006 |

(Continued)

OTHER PUBLICATIONS

International Search Report and Written Opinion for PCT/US2020/044941 dated Nov. 11, 2020.
(Continued)

*Primary Examiner* — Jennifer Wecker
*Assistant Examiner* — Patrick S Ott
(74) *Attorney, Agent, or Firm* — Patterson + Sheridan, LLP

(57) ABSTRACT

Disclosed are embodiments for an engineered feature formed as a part of or on a chamber component. In one embodiment, a chamber component for a processing chamber includes a component part body having unitary monolithic construction. The component part body has an outer surface. An engineered complex surface is formed on the outer surface. The engineered complex surface has a first lattice framework formed from a plurality of first interconnected laths and a plurality of first openings are bounded by three or more laths of the plurality of laths.

14 Claims, 6 Drawing Sheets

(51) Int. Cl.

| | | |
|---|---|---|
| *H01J 37/34* | (2006.01) | |
| *C23C 16/44* | (2006.01) | |
| *B81C 1/00* | (2006.01) | |
| *B33Y 80/00* | (2015.01) | |
| *B22F 10/00* | (2021.01) | |
| *B29L 31/18* | (2006.01) | |
| *F27D 1/00* | (2006.01) | |
| *B29L 31/34* | (2006.01) | |
| *F27B 15/06* | (2006.01) | |
| *B29L 31/00* | (2006.01) | |
| *E04B 2/00* | (2006.01) | |
| *F16M 1/08* | (2006.01) | |
| *B01L 1/00* | (2006.01) | |

(52) U.S. Cl.
CPC ...... *B81C 1/00373* (2013.01); *C23C 16/4404* (2013.01); *H01J 37/32477* (2013.01); *H01J 37/3488* (2013.01); *B01L 1/00* (2013.01); *B29L 2031/18* (2013.01); *B29L 2031/3481* (2013.01); *B29L 2031/7156* (2013.01); *E04B 2/00* (2013.01); *F16M 1/08* (2013.01); *F27B 15/06* (2013.01); *F27D 1/0006* (2013.01); *H01J 37/3211* (2013.01); *H01J 37/32495* (2013.01); *H01J 37/32807* (2013.01); *Y10T 428/139* (2015.01)

(58) Field of Classification Search
CPC ............... B01L 1/025; B29L 2031/18; B29L 2031/3481; B29L 2031/7156; E04B 2/00; F16M 1/08; F27B 15/06; F27D 1/0006; Y10T 428/139; Y02P 10/25
See application file for complete search history.

(56) References Cited

U.S. PATENT DOCUMENTS

| | | | | |
|---|---|---|---|---|
| 6,645,357 | B2 * | 11/2003 | Powell | H01J 37/3441 |
| | | | | 204/298.11 |
| 6,752,911 | B2 * | 6/2004 | Jung | C23C 14/541 |
| | | | | 204/298.18 |
| 6,933,508 | B2 | 8/2005 | Popiolkowski et al. | |
| 2004/0056211 | A1 | 3/2004 | Popiolkowski et al. | |
| 2005/0284756 | A1 | 12/2005 | Hom et al. | |
| 2009/0237901 | A1 | 9/2009 | Fjelstad | |
| 2012/0258280 | A1 * | 10/2012 | Jackson | C23C 16/4404 |
| | | | | 428/156 |
| 2013/0029480 | A1 | 1/2013 | Niklaus et al. | |
| 2014/0116338 | A1 | 5/2014 | He et al. | |
| 2014/0231914 | A1 | 8/2014 | Chang et al. | |
| 2015/0021628 | A1 | 1/2015 | Medendorp, Jr. et al. | |
| 2016/0233060 | A1 * | 8/2016 | Narendrnath | H01J 37/32871 |
| 2017/0065400 | A1 | 3/2017 | Armstrong et al. | |

FOREIGN PATENT DOCUMENTS

| | | |
|---|---|---|
| CN | 1293596 C | 1/2007 |
| CN | 103430280 A | 12/2013 |
| EP | 2156941 A1 | 2/2010 |
| JP | 2002319520 A | 10/2002 |
| JP | 2013232642 A | 11/2013 |
| WO | 2005001918 A1 | 1/2005 |
| WO | 2008130975 A1 | 10/2008 |

OTHER PUBLICATIONS

Office Action for Taiwan Application No. 109132822 dated Jun. 16, 2022.

* cited by examiner

LATTICE COAT SURFACE ENHANCEMENT FOR CHAMBER COMPONENTS

BACKGROUND OF THE INVENTION

Field of the Invention

Embodiments of the invention relate to chamber components for equipment used in the manufacturing of semiconductor devices

Description of the Related Art

Reliably producing sub-half micron and smaller features is one of the key technology challenges for next generation very large scale integration (VLSI) and ultra large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

As the dimensions of the integrated circuit components are reduced (e.g., to deep sub-micron dimensions), the materials used to fabricate such components must be carefully selected in order to obtain satisfactory levels of electrical performance. For example, when the distance between adjacent metal interconnects and/or the thickness of the dielectric bulk insulating material that isolates interconnects having sub-micron dimensions, the potential for capacitive coupling occurs between the metal interconnects is high. Capacitive coupling between adjacent metal interconnects may cause cross talk and/or resistance-capacitance (RC) delay which degrades the overall performance of the integrated circuit and may render the circuit inoperable.

The manufacture of the sub-half micron and smaller features rely upon a variety of processing equipment, such as physical vapor deposition chambers (PVD) among others. The deposition chambers use RF coils to maintain a plasma in the processing chamber. Existing chamber components utilized in PVD chambers may have a high temperature differential which causes high film stress for materials that adhere to the components during the operation of the PVD chamber. The higher film stress may result in flaking of the deposited material during operation of the PVD chamber after the film has reached a critical thickness. The flaking of the deposited material results in increased of contamination (i.e., particles) of the interior of the PVD chamber, which contributes to substrate defects and low yield. Thus, the high risk of contamination undesirably demands increased frequency for cleaning and maintenance of the PVD chamber.

Therefore, there is a need for improved chamber components that help reduce contamination of processing chambers.

SUMMARY

Disclosed are embodiments for an engineered feature formed as a part of or on a chamber component. In one embodiment, a chamber component for a processing chamber includes a component part body having unitary monolithic construction. The component part body has an outer surface. An engineered complex surface is formed on the outer surface. The engineered complex surface has a first lattice framework formed from a plurality of first interconnected laths and a plurality of first openings is bounded by three or more laths of the plurality of laths.

BRIEF DESCRIPTION OF THE DRAWINGS

So that the manner in which the above recited features of the present invention can be understood in detail, a more particular description of the invention, briefly summarized above, can be had by reference to embodiments, some of which are illustrated in the appended drawings. It is to be noted, however, that the appended drawings illustrate only typical embodiments of this invention and are therefore not to be considered limiting of its scope, for the invention can admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

Figure 1:
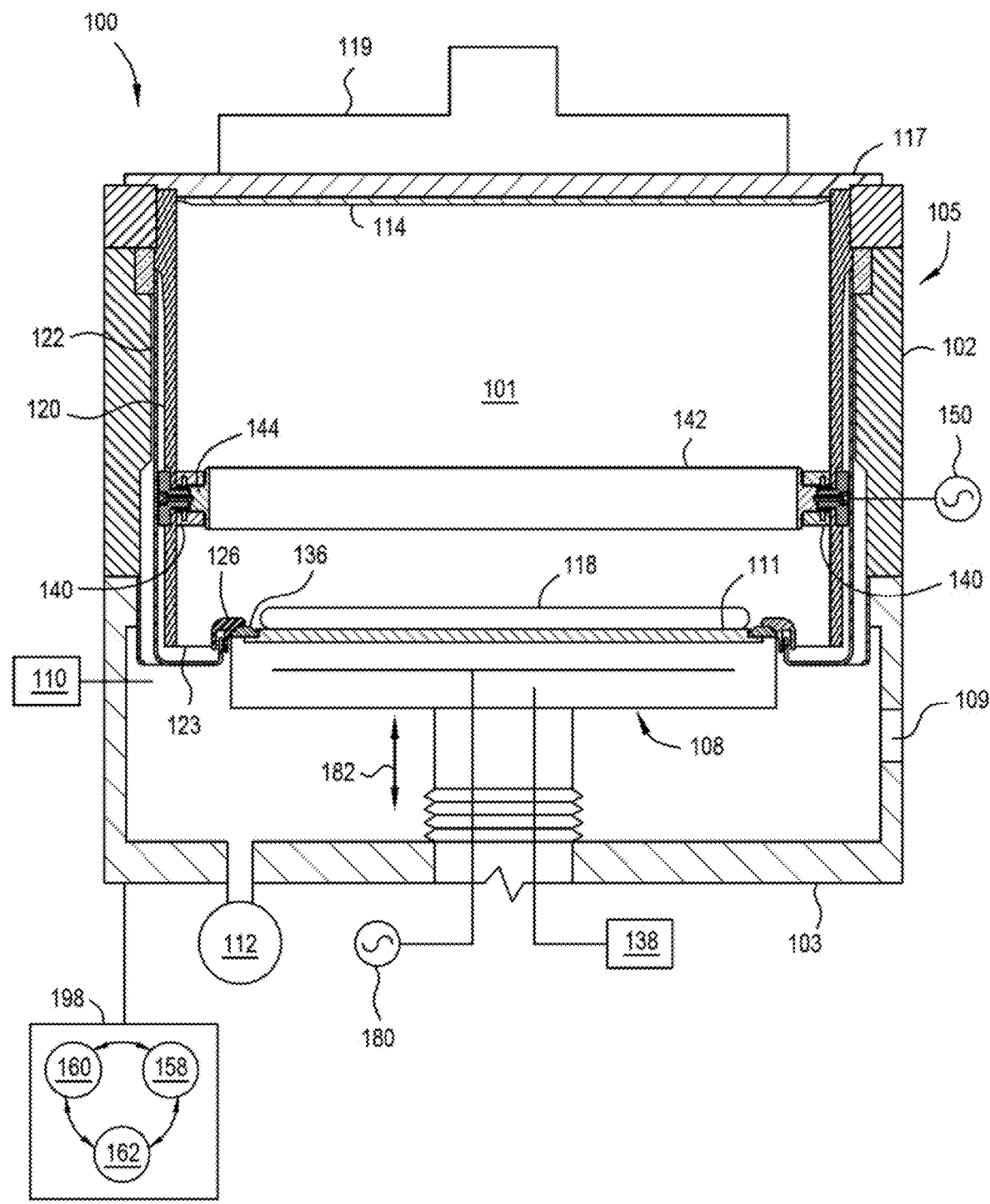
FIG. 1 depicts a schematic cross-sectional view of one embodiment of a process chamber having components suitable for an engineered complex surface.

It is to be noted, however, that the appended drawings illustrate only exemplary embodiments of this invention and are therefore not to be considered limiting of its scope, for the invention may admit to other equally effective embodiments.

DETAILED DESCRIPTION

The term "engineered" as used in the engineered complex surface, as well as the engineered features, refers to the skillful and deliberate arrangement of features rather than the features arising naturally, randomly or spontaneously. Engineered features are formed by deliberately placing material in a pre-defined location. The engineered feature, in one example, is a lattice framework, or arrangements of crossing laths or other thin strips of material, forming a continuous grid like structure having a plurality of openings formed between the intersections of the laths. An engineered feature may be formed by a variety of techniques that allow precise placement of material in a mapped location with a known result. An example of a non-engineered feature may include a sponge, steel wool, a sprayed coating, etc. and other techniques, such as spraying, ablation, sanding and grit blasting that do not control the precise placement of the material in the formation of the feature.

Particle entrapment and adhesion in processing chambers can be enhanced by an engineered complex surface formed on an outer surface of processing chamber components. The engineered complex surface may involve one or more engineered continuous lattice-like texturing. The lattice texture has a plurality of laths and openings. One or more additional lattice textures may be incorporated in the engineered complex surface to improve retention of deposited materials. The engineered complex texture counters the highly compressive film stress which eventually leads to surface peeling of films deposited on conventional chamber components. Thus, the engineered complex texture promotes service life of components, and longer mean times between chamber cleans with less particle contamination of the processing chamber, which results in higher yield and more robust and reliable device performance. The multiple layers of the lattice framework in the engineered complex texture can be manufactured with or without the chamber component by additive manufacturing.

Additive manufacturing techniques for manufacturing form three dimensional components by laying down successive thin layers of material. Additive manufacturing techniques for manufacturing, which 3D printing is but one example, used in the semiconductor industry for manufacturing semiconductor processing chamber components (which include, but are not limited to, coil cups) for plasma deposition chambers can provide improved adhesion of deposition material on the surface of the chamber component.

In a 3D printing process, a thin layer of precursor, e.g., a powder or other feed stock material is progressively deposited and fused to form a full 3-dimensional component of the chamber. This additive manufacturing technique enables surfaces of the chamber component to be engineered to provide improved film adhesion, which inhibits flaking of the film from the chamber component where the flakes become a process contaminant. This additive manufacturing technique may additionally or alternatively enable surfaces of the chamber components to be engineered to minimize thermal temperature changes during processing across the surface of the component, which in turn results in a lower film stress of materials adhered to the surface of the chamber component. In some embodiments, a single step production may produce monolithic components which may be formed from one or more material layers. The material layers, may be selected to provide localized strength, cost savings, heat transfer, optical reflectivity, or other beneficial properties. Although 3D printing is described as advantageously enabling the geometric form of the chamber component, it is contemplated that chamber components having similar geometry may be fabricated utilizing other manufacturing techniques.

As introduced above, some chamber components fabricated utilizing additive manufacturing techniques may be designed to promote film adhesion and have lower temperature differentials across the component during operation of the processing chamber. For example, a coil cup used in a PVD chamber that has a lower temperature differential which will in turn help reduce film stress of material which may be inadvertently deposited on the coil cup during substrate deposition operations performed in the PVD chamber. The reduced film stress increases adhesion of the PVD films to the cup. The increased adhesion of the film to the cup resists flaking and thus, reduces contamination in the PVD chamber. Since the potential for contamination is reduced, the frequency for cleaning and maintaining the PVD chamber (also known as the mean time between cleaning (MTBC)) may be advantageously extended. Surfaces of the chamber components may have features that promote film adhesion to the cup. The adhesion features may include surface textures, such as knurled surfaces, increased roughness, dimples, grooves, protrusions or other adhesion enhancing surface features.

Implementations of the invention may include one or more of the following. A chamber component having an outer surface formed with engineered surface features that improve adhesion of deposition materials from the process chamber, and thus reducing the tendency of the deposited material to flake off over time.

In embodiments wherein the chamber component is fabricated using additive manufacturing techniques, the chamber component printed material may be solidified using a curing process. The chamber component may be formed from a material precursor which includes properties which demonstrate resistance to high temperatures. Abrasives or other particles may be supplied in the precursor material utilized to fabricate the chamber component which enhances texturing of the surface for the chamber component. Additionally, a plurality of printed precursor materials may be used in forming different portions of the chamber component. The chamber component precursor material may alternately be a melted material which is solidified by cooling. Alternately, the chamber component may be formed using a manufacturing technique separate from and texturing of the surface may be formed using a subsequent additive technique of manufacturing.

Advantages of the invention may include one or more of the following. A chamber component which can be manufactured within very tight tolerances, i.e., with good thickness uniformity and control. Grooves and other geometric features may be formed in the chamber component in portions not accessible using traditional manufacturing methods. Additive manufacturing enables complex shapes and geometries that are difficult or impossible to replicate with traditional methods of manufacturing. Additionally, the 3D printed chamber component may be manufactured faster and cheaper than other similarly shaped conventional chamber component.

Referring now to FIG. 1, FIG. 1 illustrates an exemplary physical vapor deposition (PVD) processing chamber 100 having components suitable for an engineered complex surface 300. The engineered complex surface 300 has at least a first lattice framework 104 suitable for particle entrapment. The lattice framework 104 is a continuous engineered feature that may surround or otherwise enclose a surface of the chamber component as a layer for entrapping particles in the lattice structure. An example of suitable a PVD chamber includes the SIP ENCORE® PVD processing chamber, commercially available from Applied Materials, Inc., Santa Clara, of California. It is contemplated that processing chambers, including those available from other manufactures, may also be adapted to benefit from the examples described herein. In one embodiment, the processing chamber 100 is capable of depositing, for example, titanium, aluminum oxide, aluminum, aluminum nitride, copper, tantalum, tantalum nitride, titanium nitride, tungsten, or tungsten nitride on a substrate 118.

The processing chamber 100 having an inductive coil 142, according to one embodiment. The processing chamber 100 has a body 105 that includes sidewalls 102, a bottom 103, and a lid 117 that encloses an interior volume 101. A substrate support, such as a pedestal 108, is disposed in the interior volume 101 of the processing chamber 100. A substrate transfer port 109 is formed in the sidewalls 102 for transferring substrates into and out of the interior volume 101.

A gas source 110 is coupled to the processing chamber 100 to supply process gases into the interior volume 101. In one embodiment, process gases may include inert gases, non-reactive gases, and reactive gases, if necessary. Examples of process gases that may be provided by the gas source 110 include, but not limited to, argon gas (Ar), helium (He), neon gas (Ne), nitrogen gas ($N_2$), oxygen gas ($O_2$), and $H_2O$ among others.

A pumping device 112 is coupled to the processing chamber 100 in communication with the interior volume 101 to control the pressure of the interior volume 101. In one embodiment, the pressure of the processing chamber 100 may be maintained at about 1 Torr or less. In another embodiment, the pressure within the processing chamber 100 may be maintained at about 500 milliTorr or less. In yet another embodiment, the pressure within the processing chamber 100 may be maintained at about 1 milliTorr and about 300 milliTorr.

The lid 177 may support a sputtering source, such as a target 114. The target 114 generally provides a source of material which will be deposited in the substrate 118. The target 114 may be fabricated from a material containing titanium (Ti) metal, tantalum metal (Ta), tungsten (W) metal, cobalt (Co), nickel (Ni), copper (Cu), aluminum (Al), alloys thereof, combinations thereof, or the like. In an exemplary embodiment depicted herein, the target 114 may be fabricated by titanium (Ti) metal, tantalum metal (Ta) or aluminum (Al).

The target 114 may be coupled to a DC source power assembly 116. A magnetron 119 may be coupled adjacent to the target 114. Examples of the magnetron 119 assembly include an electromagnetic linear magnetron, a serpentine magnetron, a spiral magnetron, a double-digitated magnetron, a rectangularized spiral magnetron, among others. Alternately, powerful magnets may be placed adjacent to the target 114. The magnets may rare earth magnets such as neodymium or other suitable materials for creating a strong magnetic field. The magnetron 119 may confine the plasma as well as distributing the concentration of plasma along the target 114.

A controller 198 is coupled to the processing chamber 100. The controller 198 includes a central processing unit (CPU) 160, a memory 158, and support circuits 162. The controller 198 is utilized to control the process sequence, regulating the gas flows from the gas source 110 into the processing chamber 100 and controlling ion bombardment of the target 114. The CPU 160 may be of any form of a general purpose computer processor that can be used in an industrial setting. The software routines can be stored in the memory 158, such as random access memory, read only memory, floppy or hard disk drive, or other form of digital storage. The support circuits 162 are conventionally coupled to the CPU 160 and may comprise cache, clock circuits, input/output subsystems, power supplies, and the like. The software routines, when executed by the CPU 160, transform the CPU 160 into a specific purpose computer (controller) 198 that controls the processing chamber 100 such that the processes are performed in accordance with the present invention. The software routines may also be stored and/or executed by a second controller (not shown) that is located remotely from the processing chamber 100.

An additional RF power source 180 may also coupled to the processing chamber 100 through the pedestal 108 to provide a bias power between the target 114 and the pedestal 108, as needed. In one embodiment, the RF power source 180 may provide power to the pedestal 108 to bias the substrate 118 at a frequency between about 1 MHz and about 100 MHz, such as about 13.56 MHz.

The pedestal 108 may be moveable between a raised position and a lowered position, as shown by arrow 182. In the lowered position, a top surface 111 of the pedestal 108 may be aligned with or just below the substrate transfer port 109 to facilitate entry and removal of the substrate 118 from the processing chamber 100. The top surface 111 may have an edge deposition ring 136 sized to receive the substrate 118 thereon while protecting the pedestal 108 from plasma and deposited material. The pedestal 108 may be moved to the raised position closer to the target 114 for processing the substrate 118 in the processing chamber 100. A cover ring 126 may engage the edge deposition ring 136 when the pedestal 108 is in the raised position. The cover ring 126 may prevent deposition material from bridging between the substrate 118 and the pedestal 108. When the pedestal 108 is in the lowered position, the cover ring 126 is suspended above the pedestal 108 and substrate 118 positioned thereon to allow for substrate transfer.

During substrate transfer, a robot blade (not shown) having the substrate 118 thereon is extended through the substrate transfer port 109. Lift pins (not shown) extend through the top surface 111 of the pedestal 108 to lift the substrate 118 from the top surface 111 of the pedestal 108, thus allowing space for the robot blade to pass between the substrate 118 and pedestal 108. The robot may then carry the substrate 118 out of the processing chamber 100 through the substrate transfer port 109. Raising and lowering of the pedestal 108 and/or the lift pins may be controlled by the controller 198.

During sputter deposition, the temperature of the substrate 118 may be controlled by utilizing a thermal controller 138 disposed in the pedestal 108. The substrate 118 may be heated to a desired temperature for processing. After processing, the substrate 118 may be rapidly cooled utilizing the thermal controller 138 disposed in the pedestal 108. The thermal controller 138 controls the temperature of the substrate 118, and may be utilized to change the temperature of the substrate 118 from a first temperature to a second temperature in a matter of seconds to about a minute.

An inner shield 120 may be positioned in the interior volume 106 between the target 114 and the pedestal 108. The inner shield 120 may be formed of aluminum or stainless steel among other materials. In one embodiment, the inner shield 120 is formed from stainless steel. An outer shield 122 may be formed between the inner shield 120 and the sidewall 102. The outer shield 122 may be formed from aluminum or stainless steel among other materials. The outer shield 122 may extend past the inner shield 120 and is configured to support the cover ring 126 when the pedestal 108 is in the lowered position.

In one embodiment, the inner shield 120 includes a radial flange 123 that includes an inner diameter that is greater than an outer diameter of the inner shield 120. The radial flange 123 extends from the inner shield 120 at an angle greater than about ninety degrees (90°) relative to the inside diameter surface of the inner shield 120. The radial flange 123 may be a circular ridge extending from the surface of the inner shield 120 and is generally adapted to mate with a recess formed in the cover ring 126 disposed on the pedestal 108. The recessed may be a circular groove formed in the cover ring 126 which centers the cover ring 126 with respect to the longitudinal axis of the pedestal 108.

The inductive coil 142 of the processing chamber 100 may having one turn. The inductive coil 142 may be just inside the inner shield 120 and positioned above the pedestal 108. The inductive coil 142 may be positioned nearer to the pedestal 108 than the target 114. The inductive coil 142 may be formed from a material similar in composition to the target 114, such as tantalum, to act as a secondary sputtering target. The inductive coil 142 is supported from the inner shield 120 by a plurality of coil spacers 140. The coil spacers 140 may electrically isolated the inductive coil 142 from the inner shield 120 and other chamber components.

The inductive coil 142 may be coupled to a power source 150. The power source 150 may have electrical leads which penetrate the sidewall 102 of the processing chamber 100, the outer shield 122, the inner shield 120 and the coil spacers 140. The electrical leads connect to a tab 144 on the inductive coil 142 for providing power to the inductive coil 142. The tab 144 may have a plurality of insulated electrical connections for providing power to the inductive coil 142. Additionally, the tabs 144 may be configured to interface with the coil spacers 140 and support the inductive coil 142. The power source 150 applies current to the inductive coil 142 to induce an RF field within the processing chamber 100 and couple power to the plasma for increasing the plasma density, i.e., concentration of reactive ions.

Figure 2:
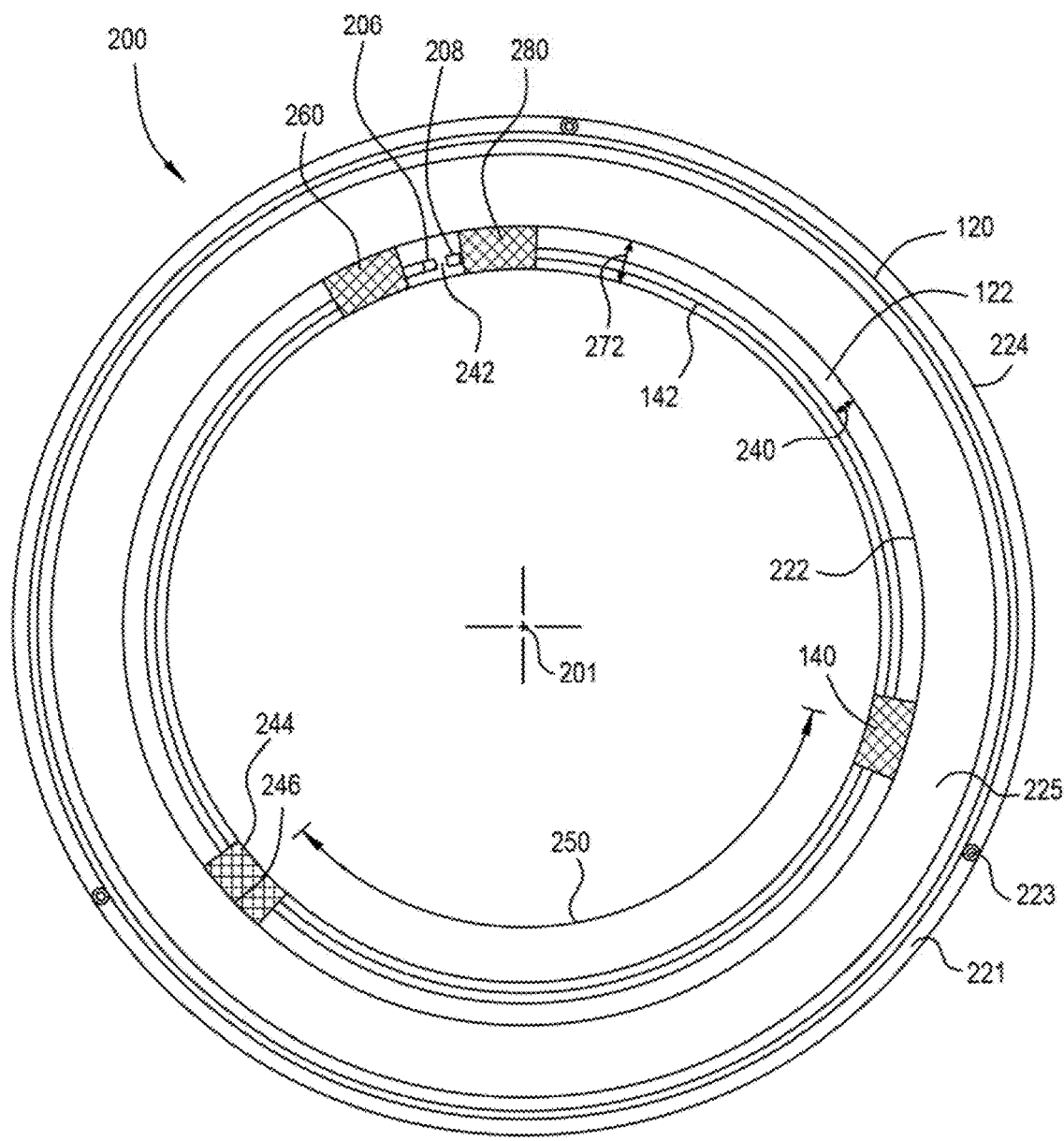
FIG. 2 depicts a process kit for the processing chamber illustrated in FIG. 1 having a cup coil spacer.

FIG. 2 depicts a schematic top-view diagram of a process kit 200 for the processing chamber 100 having the coil spacer 140, as shown in FIG. 1. The process kit 200 includes the inner shield 120, the outer shield 122 and the inductive coil 142. The process kit 200 may additionally, or alternately, include a deposition ring, a cover ring, a shadow ring, a focus ring, a shadow frame and the like. The process kit 200 has a central axis 201 about which the inner shield 120, the outer shield 122 and the inductive coil 142 are centered. The central axis 201 is generally co-linear with the vertical centerline of the processing chamber 100. The inner shield 120 has a top surface 225, an inner surface 222 and an outer surface 224, one or more of which may have an engineered complex surface 300.

Referring additionally to FIG. 1, the inner surface 222 of the inner shield 120 is exposed to the interior volume 106 of the processing chamber 100. The outer surface 224 is disposed adjacent to the sidewall 102 and the outer shield 122. The top surface 111 is disposed adjacent to the lid 177 of the processing chamber 100. The inner shield 120 has a plurality of fasteners 223 along a lower top surface 221 for attaching the inner shield 120 to the outer shield 122.

The outer shield 122 is disposed along the outer surface 224 and extends under the inner shield 120. The outer shield 122 has an inner diameter 272 which extends beyond the inner surface 222 of the inner shield 120. The inner diameter 272 is closer to the central axis 201 than the inner surface 222. In one embodiment, the inner surface 222 is closer to the central axis 201 than the inductive coil 142.

The inductive coil 142 is spaced apart from the inner surface 222 of the inner shield 120 by a distance 240 by the coil spacer 140. The coil spacer 140 has a top 244 and a bottom 246. The distance 240 is determined by how far apart the top 244 is from the bottom 246 the coil spacer 140. That is, the height of the coil spacer 140 determines the distance 240. The distance 240 may be tuned for optimizing plasma density and prevent the energized inductive coil 142 from arcing.

The coil spacers 140 may be circumferentially spaced about the central axis 201. For example, each of the plurality of the coil spacers 140 may be spaced apart by a spacing 250. The equidistant spacing 250 of adjacent coil spacers 140 provides a uniformly support the inductive coil 142.

The inductive coil 142 may have a first end 208 and a second end 206. The inductive coil 142 may have a single turn such that a gap 242 is formed between the ends 206, 208. The ends 206, 208 of the inductive coil 142 may be supported. In one example, a first coil spacer 280 of the plurality of coil spacers 140 may be interfaced with the inductive coil 142 proximate the first end 208 and a second coil spacer 260 of the plurality of coil spacers 140 may be interfaced with the inductive coil 142 proximate the second end 206 to provide support to the inductive coil near the gap 242. Alternately, the coil spacer 140 may span the gap 242 to interface with both ends 206, 208 of the inductive coil 142 physically without electrically bridging the ends 206, 208. In this manner, one coil spacer 140 may support both the first end 208 and the second end 206.

As discussed above, the inductive coil 142 may be supported by a plurality of coil spacers 140. For example, the inductive coil 142 may have three or more coil spacers 140 for supporting the inductive coil 142. In one embodiment, the first coil spacer 280 of the plurality of coil spacers 140 may have an electrical connector for providing power to inductive coil 142. In one embodiment, the second coil spacer 260 of the plurality of coil spacers 140 may have an electrical return path for coupling the inductive coil 142 to ground. Alternately, the first coil spacer 280 may provide both power and return paths through the first coil spacer 280 to the inductive coil 142.

It should be appreciated that the term "engineered" as used in the engineered complex surface 300, as well as the first lattice framework 104 used in the formation of the engineered complex surface 300, refers to definition of engineered as provided above. The lattice framework 104 is an arrangement of crossing laths or other thin strips of material, forming a continuous grid like structure having a plurality of openings formed between the intersections of the laths.

The first lattice framework 104 of the engineered complex surface 300 can be formed by several additive manufacturing techniques as discussed above and is not limited to any 3D printing technology such as powder bed infusion technology. The lattice framework 104 can be applied directly on any part surface, formed with any part, or sleeved over any part based on the manufacturing capabilities. It should additionally be appreciated that the first lattice framework 104 can be utilized in other processing chambers and chamber components, where particle contamination is a concern due to particle build up on chamber component surfaces.

Figure 3A:
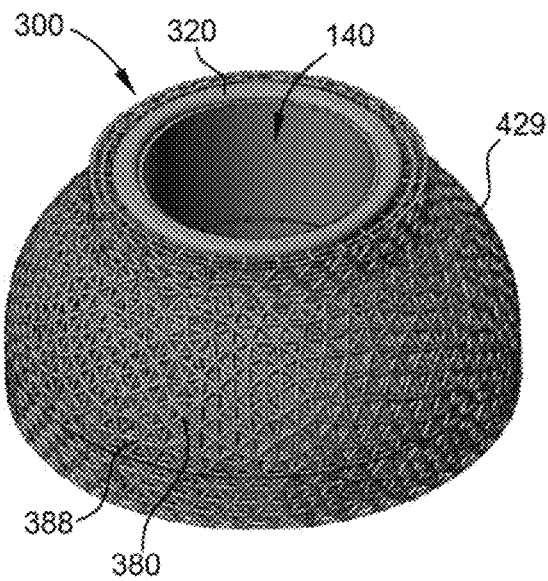
FIG. 3A depicts an isometric view of the cup coil spacer illustrated in FIG. 2.
Figure 3B:
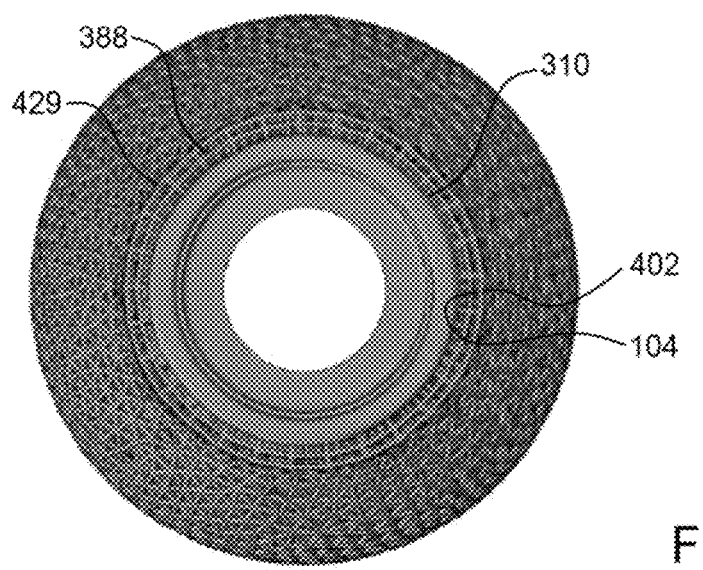
FIG. 3B depicts a top plan view of the cup coil spacer.
Figure 3C:
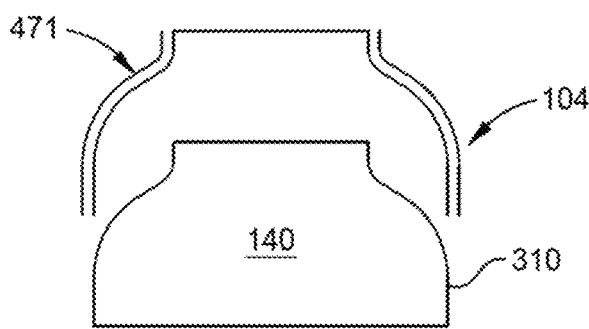
FIG. 3C depicts a side schematic view the cup coil spacer.

An exemplary example of a chamber component having the engineered complex surface 300, with at least the first lattice framework 104, will now be described relative to the coil spacer 140. FIGS. 3A through 3C illustrate various arrangements for the coil spacer 140 which are configured to inhibit flaking of deposited material. FIG. 3A depicts an isometric view of the coil spacer illustrated in FIG. 2. FIG. 3B depicts a top plan view of the coil spacer. FIG. 3C depicts a side schematic view the coil spacer.

The coil spacers 140 have a component part body 320. The component part body 320 may be of unitary monolithic construction. Alternately, the component part body 320 may be of a multi-piece construction In some examples, the coil spacers 140 may be formed by one or more other manufacturing techniques, such as machining. In other examples, the coil spacers 140 may be formed using an additive manufacturing method, such as 3D printing. The coil spacers 140 may be fabricated using a 3D printing process that forms the coil spacers 140 from sequential deposition of material, for example, in multiple layers that are fused into a singular monolithic structure. Suitable techniques for 3D printing coil spacers 140 may generally include directed energy deposition, powder bed fusion, or sheet lamination among other techniques. For example, a polyjet 3D technique is a layer additive technology with layers as thin as 16 microns (0.0006"). The polyjet rapid prototyping process uses high resolution ink-jet technology combined with UV curable materials to create highly detailed and accurate layers or surface finishes in the coil spacers 140. In another example, the 3D printer uses fused deposition modeling (FDM) to additively lay material down in layers. A filament or wire of the coil spacer material is unwound from a coil and fused together to produce the coil spacers 140. In yet another example, the 3D printer inkjets a binder into a powder bed. This technique is known as "binder jetting" or "drop-on-powder". The powder bed may contain additives as well as base materials for producing features and characteristics in the coil spacers 140. The inkjet print head moves across a bed of powder, selectively depositing a liquid binding material. A thin layer of powder is spread across the completed section and the process is repeated with each layer adhering to the last. In another example, coil spacers 140 may be 3D printed using selective laser sintering. A laser or other suitable power source sinters powdered material by aiming the laser automatically at points in the powder defined by a 3D model. The laser binds the material together to create a solid monolithic structure. When a layer is finished, the build platform moves downward and a new layer of material is sintered to form the next cross section (or layer) of the coil spacers 140. Repeating this process builds up the coil spacers 140 one layer at a time. Selective laser melting (SLM) uses a comparable concept, but in SLM the material is fully melted rather than sintered allowing for different crystal structure, porosity, among other properties. In another example, coil spacers 140 are generated using sheet lamination. The coil spacers 140 may be manufactured by layering sheets of material on top of one-another and binding them together. The 3D printer then slices an outline of the coil spacers 140 into the bound sheets of material. Repeating this process builds up the coil spacers 140 one layer (sheet) at a time to form a monolithic structure. In yet another example, the coil spacers 140 are generated using directed energy deposition (DEP). DEP is an additive manufacturing process in which focused thermal energy is used to fuse materials by melting them. The material may be fed into a molten pool created by an electron beam which is then guided by a computer to move about to form a layer of the coil spacers 140 on a build platform to form a monolithic structure. It should be appreciated that the example techniques discussed above are suitable for 3D printing the coil spacers 140, or cups of the coil spacers, as are other 3D printing techniques not discussed. It should also be appreciated that other additive and conventional (subtractive) manufacturing techniques may be utilized in the manufacture of the coil spacers 140.

Figure 4A:
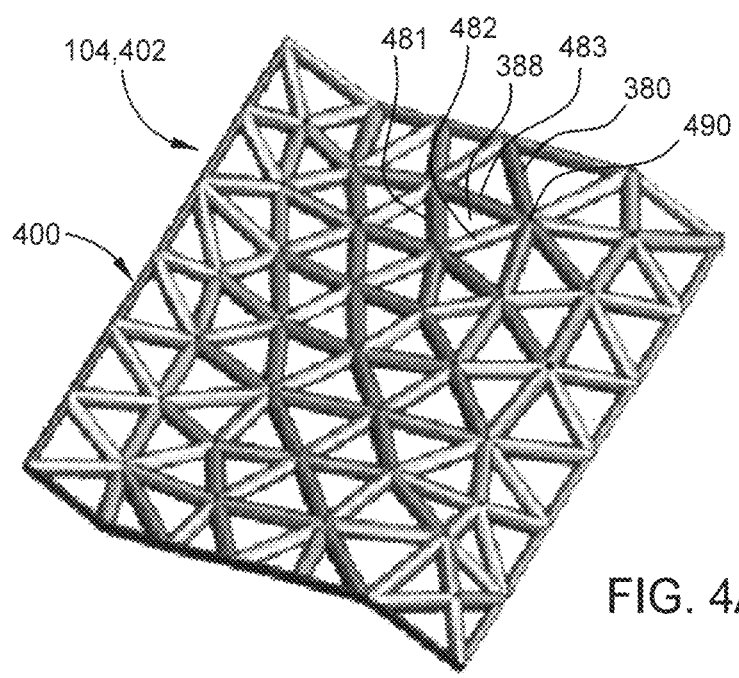
FIG. 4A-4C illustrates various embodiments for an engineered complex surface as applied to the cup coil spacer of FIG. 3A.
Figure 4B:
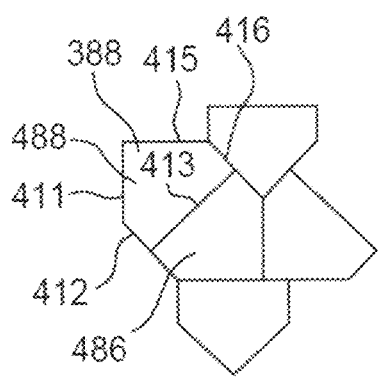
Figure 4C:
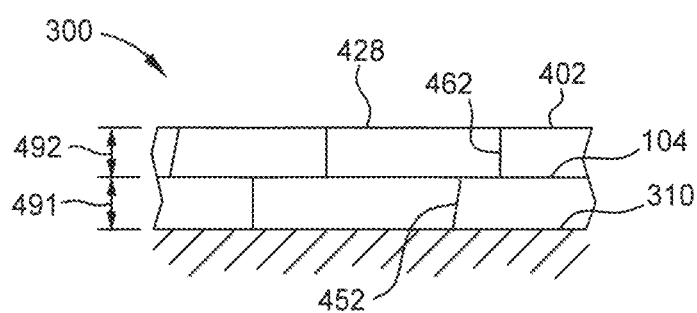

The features of the first lattice framework 104 are more easily seen in FIGS. 4A through 4C. FIGS. 4A-4C illustrates various embodiments for an engineered surface as applied to the coil spacer of FIG. 3A. The discussion of FIGS. 3A through 3C will additionally utilize FIG. 4A-4C to add visual clarity to the description of the first lattice framework 104.

The first lattice framework 104 is formed about an outer surface 310 of the component part body 320 of the coil spacer 140. The first lattice framework 104 forms a continuous surface about the outer surface. A first spacer lath 452 is formed between the first lattice framework 104 and the outer surface 310 of the component part body 320. The first spacer lath 452 is in contact with both the outer surface 310 and the first lattice framework 104. The first spacer lath 452 creates a gap 491 preventing the first lattice framework 104 from touching the outer surface 310 of the component part body 320. In one example, the first spacer lath 452 provides a consistent spacing between the first lattice framework 104 and the outer surface 310 of the component part body 320. In another example, the first spacer lath 452 provides a variable spacing between the first lattice framework 104 and the outer surface 310 of the component part body 320.

The first lattice framework 104 serves to improve particle trapping during substrate processing, which reduces chamber contamination. The first lattice framework 104 formed continuously around the outer surface 310. The first lattice framework 104 is formed from a plurality of first interconnected laths 380. A plurality of first openings 388 are bounded by three or more laths 380, e.g., such a first lath 481, a second lath 482 and a third lath 483 of the plurality of laths 380. It should be appreciated that the first openings 388, i.e., the space between the laths 380, may be formed from more than three laths 380. For example, a first opening 388 may be formed from a fourth lath 411, a fifth lath 412, a sixth lath 413, a seventh lath 416, and an eighth lath 415. Adjacent openings 388, such as a second opening 486 and third opening 488 may share a common lath, such as the sixth lath 413. The laths 380 intersect at a node 490. The node 490 includes and is part of all the interconnected laths 380, i.e., each interconnected lath of the laths 380 share the node. In yet other examples, the laths 380 may basket weave in the formation of the respective first lattice framework and/or second lattice framework 402.

It should be appreciated that although the laths 380 are described above as individual pieces, the laths 380 are formed from continuous material in the formation of the first lattice framework 104. It should also be appreciated that the first openings 388 in the first lattice framework 104 be formed by a different number of laths 380 or even different length laths 380 such that the first lattice framework 104 may have different sized openings 388. Additionally, different length laths 380 may result in irregularly shaped openings 388. Alternately or additionally, one or more of the openings 388 in the first lattice framework 104 may have a different shape than an adjacent or other one of the openings 388.

The first lattice framework 104 can be formed by several additive manufacturing techniques as discussed above and is not limited to any 3D printing technology such as powder bed infusion technology. Based on the manufacturing technique utilized, the lattice framework 104 with the first spacer lath 452 is continuous about the outer surface 310 and can be formed as part of and during the fabrication on the component part body 320. Alternately, the lattice framework 104 with the first spacer lath 452 may be formed onto the component part body 320 in a separate operation. In yet other alternatives, the lattice framework 104 with the first spacer lath 452 may be a sleeve 471 which slides over the component part body 320, as shown in FIG. 3C, as part of an assembly. In one example, the first lattice framework 104 is of the same unitary monolithic construction as the component part body 320. Each lath of a plurality of laths 380 at an intersection of the plurality of laths 380 share a single mass of material at the node 490. It should additionally be appreciated that the first lattice framework can be utilized in other processing chambers and on chamber components, where particle contamination is a concern due to particle build up on chamber component surfaces.

It should also be appreciated that a cross-sectional profile of the laths 380 may be presented in two-dimensions by a number of shapes. For example, the laths 380 may have an oval cross-sectional profile. Alternately, the laths 380 may have a polynomial shaped cross-sectional profile, such as a pentagon, rectangle, triangle, rhombus or any other suitable shape. The cross-sectional shape of the laths 380 may be optimize to allow particles to slide in a first direction into the first openings 388 while preventing the same particles from leaving the first openings 388. For example, the laths 380 cross-sectional profile may be angular along the first openings 388 wherein a first area for one of the first openings 388 at the outer most portion of the laths 380 is greater than a second area of the same one of the first openings 388 adjacent the first spacer lath 452. Thus, the cross-sectional profile of the laths 380 may aid in trapping particles in the first openings 388

A second lattice framework 402 may optionally be formed about the first lattice framework 104 as part of the engineered complex surface 300. The second lattice framework 402 is formed from a plurality of interconnected second laths 428. A plurality of second openings 429 are bounded by three or more second laths of the plurality of second laths 428. A second spacer lath 462 is formed between the first lattice framework 104 and the second lattice framework 402. The second spacer lath 462 creates a gap 492 preventing the first lattice framework 104 from touching the second lattice framework 402. In one example, the laths 380 of the first lattice framework 104 align with the laths of the second lattice framework 402. In other examples, the laths 380 of the first lattice framework 104 do not align with the laths of the second lattice framework 402.

The basic form of the second lattice framework 402 may be substantially similar to the first lattice framework 104. However, it should be appreciated that the first lattice framework 104 and the second lattice framework 402 may differ in the number of laths 428, size and shape of the openings 388, 429 and the alignment of the first lattice framework 104 and the second lattice framework 402. For example, a first shape of the first openings 388 in the first lattice framework 104 may be dissimilar from a second shape of the second openings 486 in the second lattice framework. In another example, the first openings 388 do not align with the second openings 429. In yet other example, one or more of the first openings 388 is larger than a respective one or more of the second openings 429. The arrangement of first openings 388 with the second openings 429 may aid in trapping and holding particles in first lattice framework 104 and second lattice framework 402.

Figure 5A:
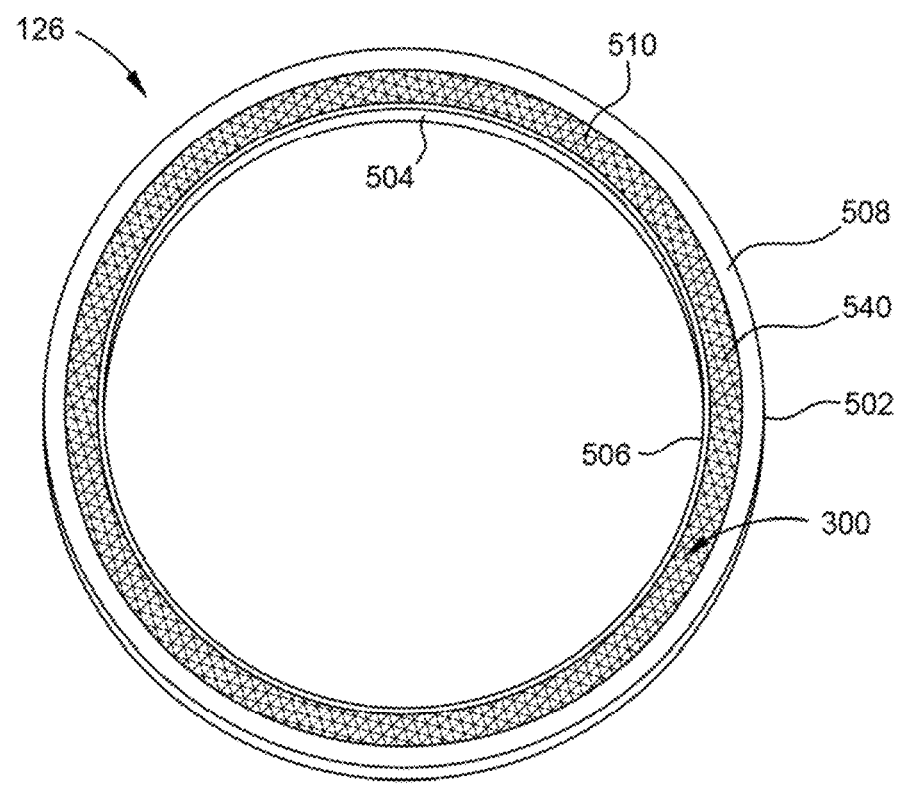
FIG. 5A depicts an isometric view of a cover ring illustrated in FIG. 2 having an embodiment of the engineered complex surface.
Figure 5B:
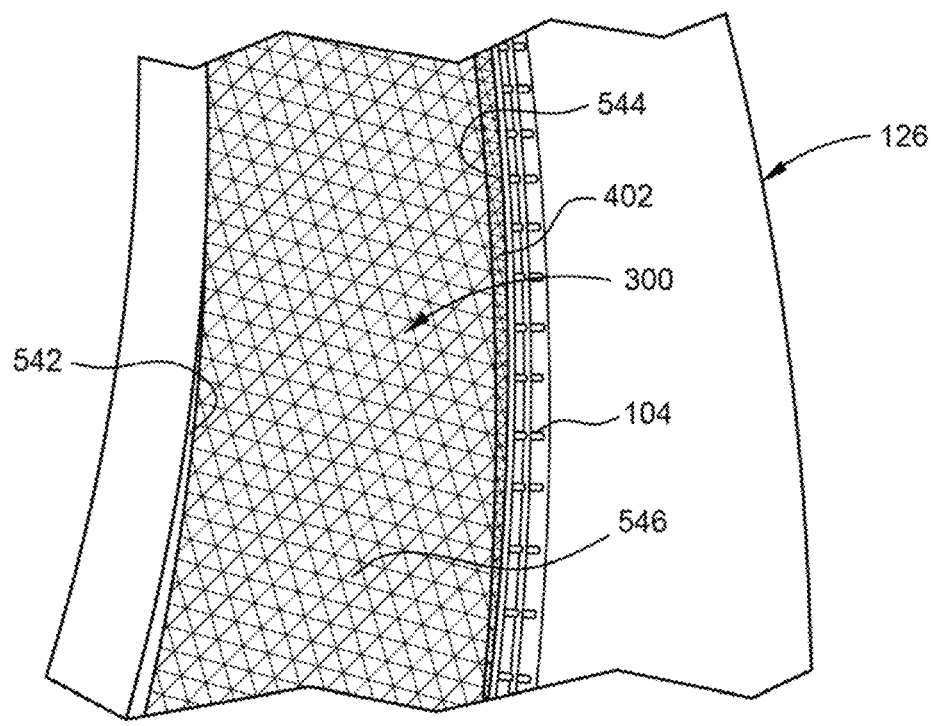
FIG. 5B depicts an enlarged view for a portion of the cover ring illustrated in FIG. 5A.

The engineered complex surface 300 can be applied additionally to other chamber components. For example, other chamber component which may include an engineered complex surface 300 include, but are not limited to, the deposition ring 136, the cover ring 126, the inner shield 120, or other desired chamber component. FIG. 5A depicts an isometric view of a cover ring 126 illustrated in FIG. 2 having an embodiment of the engineered complex surface 300. FIG. 5B depicts an enlarged view for a portion of the cover ring 126 illustrated in FIG. 5A.

The cover ring 126 has a body 510. The body 510 has an inner diameter 506, outer diameter 502, a top surface 508, and a bottom surface 504. A groove 540 is formed into the top surface 508. The groove 540 has an inner side wall 542, an outer side wall 544, and a bottom wall 546. The engineered complex surface 300 is disposed in the groove 540. The engineered complex surface 300 may extend over one or more of the inner side wall 542, the outer side wall 544, and/or the bottom wall 546. The engineered complex surface 300, illustrated in FIGS. 5A and 5B, has two layers and shows the first lattice framework 104 and the second lattice framework 402 disposed on the outer side wall 544 and the bottom wall 546. It should be appreciated however, that the engineered complex surface 300 may have one or more layers and beast disposed on one or more of the surfaces of the groove 540. The engineered complex surface 300 has first spacer lath 452 extending therefrom to space the first lattice framework 104 from the surfaces of the groove 540, i.e. the outer side wall 544 and the bottom wall 546. It should also be appreciated, that the injured complex surface may extend onto top surface 508 of the body 510 or the inner diameter 506 or outer diameter 502 of the body 510. The engineered complex surface 300 may be formed in conjunction with the cover ring 126. For example the cover ring 126 may be 3D printed with the engineered complex surface 300. Alternately the engineered complex surface 300 may be formed separately from the cover ring 126 and press fit or placed into the groove 540. It should be appreciated, that the engineered complex surface 300 may be incorporated into the cover ring 126 in a number of alternative techniques.

Figure 6A:
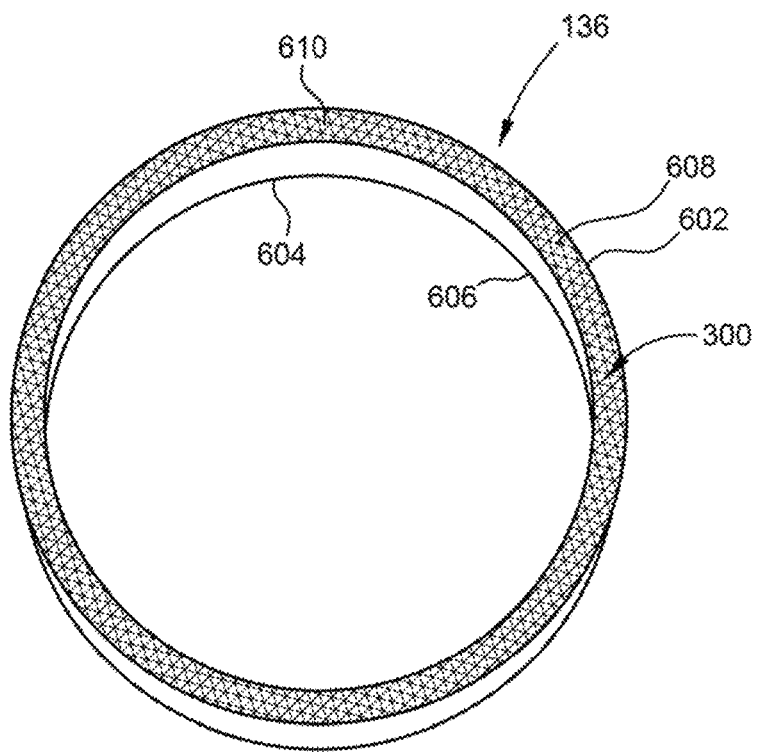
FIG. 6A depicts an isometric view of a deposition ring illustrated in FIG. 2 having an embodiment of the engineered complex surface.
Figure 6B:
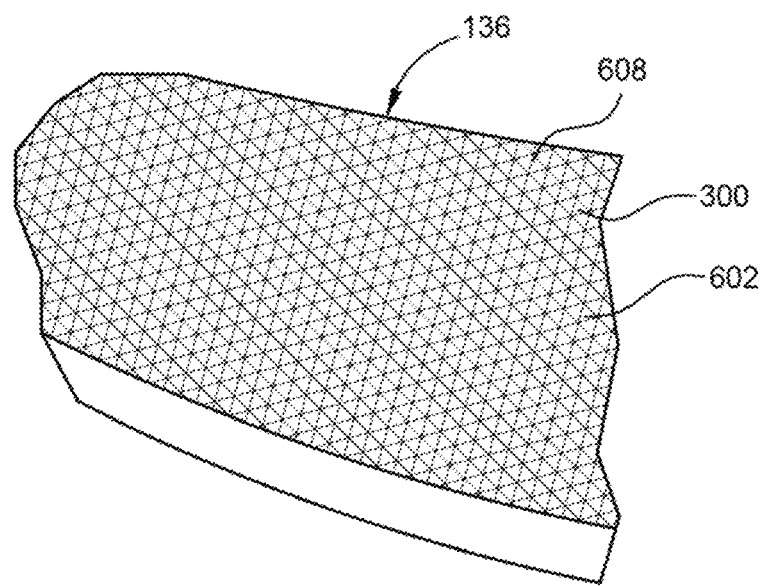
FIG. 6B depicts an enlarged view for a portion of the deposition ring illustrated in FIG. 6A.

In another example, the deposition ring 136 may include an engineered complex surface 300. FIG. 6A depicts an isometric view of a deposition ring 136 illustrated in FIG. 2 having an embodiment of the engineered complex surface 300. FIG. 6B depicts an enlarged view for a portion of the deposition ring 136 illustrated in FIG. 6A.

The deposition ring 136 has a body 610. The body 610 has an inner diameter 606, an outer diameter 602, a top surface 608, and a bottom surface 604. The engineered complex surface 300 may be formed on the body 610. The engineered complex surface 300 may extend over one or more of the inner diameter 606, the outer diameter 602, and/or the top surface 608. The engineered complex surface 300, illustrated in FIGS. 6A and 6B, may have any number of layers, i.e., the first lattice framework 104 and the second lattice framework 402, etc. disposed on the body 610 of the deposition ring 136. The engineered complex surface 300 has first spacer lath 452 extending therefrom to space the first lattice framework 104 from the body 610. The engineered complex surface 300 may be formed in conjunction with the deposition ring 136. For example the deposition ring 136 may be 3D printed with the engineered complex surface 300. Alternately the engineered complex surface 300 may be formed separately from the deposition ring 136 and sleeved over the body 610. It should be appreciated, that the engineered complex surface 300 may be incorporated into the deposition ring 136 in a number of suitable ways.

Advantageously, 3D printing of the chamber components, such as the coil spacer 140, readily allows the addition of surface features which promote adhesion of deposition materials, i.e., films, on the chamber component. The engineered complex surface 300 provided by at least the first lattice framework 104 effectively trap chamber particles to minimize process contamination. Adding additional continuous engineered features to the complex surface texture, such as second lattice framework 402, and possibly additional levels of continuous engineered features, enhances the entrapment and adhesion of the particles to minimize chamber contamination during processing substrates. Thus, the improved particle entrapment of the engineered complex surface 300 improves chamber mean time between maintenance. Additionally, utilizing the sleeve 471 disclosed above, the engineered complex surface 300 can be replaced without replacing the underlying chamber component.

While the foregoing is directed to embodiments of the present invention, other and further embodiments of the invention can be devised without departing from the basic scope thereof, and the scope thereof is determined by the claims that follow.

What is claimed is:

1. A chamber component for a processing chamber, the chamber component comprising:
   a component part body, the component part body having an outer surface; and
   an engineered complex surface disposed on the outer surface, the engineered complex surface comprising:
      a first lattice framework formed from a plurality of first interconnected laths, and wherein first openings are bounded by three or more laths of the plurality of first interconnected laths; and
      a first spacer lath extending between the first lattice framework and the outer surface of the component part body, wherein the first spacer lath is in contact with the first lattice framework and the outer surface of the component part body wherein the first spacer lath creates a gap of space preventing the first lattice framework from touching the outer surface.

2. The chamber component of claim 1, wherein the first lattice framework is a sleeve configured to slide over and fit on the component part body as an assembly and each lath of the plurality of first interconnected laths at an intersection of the plurality of first interconnected laths shares a single mass of material at the intersection.

3. The chamber component of claim 1, wherein each lath of the plurality of first interconnected laths forms a continuous feature.

4. The chamber component of claim 1, wherein the engineered complex surface further comprises:
   a second lattice framework formed on the first lattice framework, wherein the second lattice framework is formed from a plurality of interconnected second laths, and wherein second openings are bounded by three or more second laths of the plurality of second interconnected laths.

5. The chamber component of claim 4, wherein the engineered complex surface further comprises:
   a second spacer lath formed between the first lattice framework and the second lattice framework, wherein the second spacer lath creates a gap preventing the first lattice framework from touching the second lattice framework.

6. The chamber component of claim 4, wherein a first shape of the first openings in the first lattice framework is dissimilar from a second shape of the second openings in the second lattice framework.

7. The chamber component of claim 4, wherein the first openings do not align with the second openings.

8. The chamber component of claim 4, wherein one of the first openings is larger than a respective one of the second openings.

9. The chamber component of claim 4, wherein the first lattice framework is substantially similar in shape to the second lattice framework and wherein the first lattice framework shifted to misalign the first lattice framework from the second lattice framework.

10. The chamber component of claim 4, wherein the plurality of first interconnected laths of the first lattice framework do not touch the plurality of second interconnected laths of the second lattice framework.

11. The chamber component of claim 1, wherein one or more of the first openings have a different number of individual laths in the plurality of first interconnected laths.

12. The chamber component of claim 1, wherein the first lattice framework is formed in a sleeve without a backing and slides onto the outer surface.

13. The chamber component of claim 1, wherein each lath of the plurality of first interconnected laths at an intersection of the plurality of first interconnected laths shares a single mass of material at the intersection.

14. The chamber component of claim 1, wherein the chamber component is one of a deposition ring, a cover ring or a cups coil spacer.

* * * * *